United States Patent
Takaoka

(10) Patent No.: US 10,109,509 B2
(45) Date of Patent: Oct. 23, 2018

(54) METHOD FOR COOLING SEMICONDUCTOR MANUFACTURING APPARATUS AND SUBSTRATE SUPPORT APPARATUS

(71) Applicant: NISSIN ION EQUIPMENT CO., LTD., Kyoto-shi, Kyoto (JP)

(72) Inventor: Kunifumi Takaoka, Kyoto (JP)

(73) Assignee: NISSIN ION EQUIPMENT CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/667,348

(22) Filed: Aug. 2, 2017

(65) Prior Publication Data

US 2018/0144956 A1 May 24, 2018

(30) Foreign Application Priority Data

Nov. 21, 2016 (JP) ................. 2016-225938

(51) Int. Cl.
*H01L 21/425* (2006.01)
*H01L 21/67* (2006.01)
*H01L 21/677* (2006.01)
*H01L 21/683* (2006.01)

(52) U.S. Cl.
CPC .. *H01L 21/67098* (2013.01); *H01L 21/67109* (2013.01); *H01L 21/67213* (2013.01); *H01L 21/67248* (2013.01); *H01L 21/67742* (2013.01); *H01L 21/6831* (2013.01)

(58) Field of Classification Search
None
See application file for complete search history.

(56) References Cited

U.S. PATENT DOCUMENTS

| 9,184,055 B2 * | 11/2015 | Wang ................... H01L 21/6708 |
| 2003/0047551 A1 * | 3/2003 | Worm ................... B08B 7/0021 |
| | | 219/390 |
| 2006/0118043 A1 * | 6/2006 | Wagner ................. C23C 16/503 |
| | | 118/723 E |
| 2011/0299217 A1 | 12/2011 | Justesen et al. |
| 2011/0299218 A1 | 12/2011 | Lee et al. |

FOREIGN PATENT DOCUMENTS

JP  2013-534049 A  8/2013

* cited by examiner

*Primary Examiner* — Hung Vu
(74) *Attorney, Agent, or Firm* — Procopio, Cory, Hargreaves & Savitch LLP

(57) ABSTRACT

A semiconductor manufacturing apparatus, which is provided with a first storage chamber that stores a substrate to be processed, a second storage chamber that stores a dummy substrate, a substrate support apparatus with a heating function that supports a substrate, and a substrate transport apparatus that transports the substrates between the storage chambers and the substrate support apparatus, is further provided with a controller which, in the event that the temperature of substrate processing in a preceding substrate processing step is higher than the temperature of substrate processing in a subsequent substrate processing step, operates the substrate transport apparatus to transport the dummy substrate, whose temperature is lower than the temperature of substrate processing in the preceding substrate processing step, prior to carrying out the subsequent substrate processing step.

8 Claims, 6 Drawing Sheets

METHOD FOR COOLING SEMICONDUCTOR MANUFACTURING APPARATUS AND SUBSTRATE SUPPORT APPARATUS

This application claims foreign priority under 35 USC 119 based on Japanese Patent Application No. 2016-225938, filed on Nov. 21, 2016, the contents of which is incorporated herein in its entirety by reference.

BACKGROUND

1. Technical Field

The present invention relates to semiconductor manufacturing apparatus for performing substrate processing at different temperatures. In particular, it relates to a semiconductor manufacturing apparatus performing substrate processing at a lower temperature after substrate processing at a higher temperature.

2. Related Art

Depending on the materials and sizes of the substrates being handled and on the type of processing performed on the substrates, a semiconductor manufacturing apparatus is expected to perform substrate processing over a wide range of temperatures extending from high temperatures to low temperatures.

One example of such a semiconductor manufacturing apparatus is the ion implanter proposed in Patent Document 1. In that ion implanter, substrate temperature is tuned prior to substrate processing in a clamping device equipped with a resistive heater.

PRIOR ART LITERATURE

Patent Documents

[Patent Document 1]
Published Japanese Translation of PCT International Application No. 2013-534049.

SUMMARY

Problems to be Solved by the Invention

When the temperature of substrate processing is changed from a high temperature to a low temperature, the change requires comparatively more time than a change involving raising the temperature of the clamping device from a low temperature to a high temperature with the help of a heater.

For example, when switching from high-temperature processing at a heater temperature of 600° C. to 1400° C. to low-temperature (room-temperature) processing, during which the heater function is turned off, the clamping device is cooled through ambient heat loss while the heater function is turned off.

Although using water and other coolants instead of ambient heat loss in order to shorten the wait time until the clamping device reaches a predetermined temperature has also been considered, there is concern that the increased complexity of the configuration of the clamping device and the evaporation of the coolant could raise internal pressure in the tubing and damage the coolant supply path.

Accordingly, there is provided a method for cooling a semiconductor manufacturing apparatus and a substrate support apparatus that allows for the temperature of the substrate support apparatus (clamping device) to be reduced within a short time period using a simple configuration.

Means for Solving the Problems

The semiconductor manufacturing apparatus, which is a semiconductor manufacturing apparatus provided with a first storage chamber that stores a substrate to be processed, a second storage chamber that stores a dummy substrate, a substrate support apparatus with a heating function that supports a substrate, and a substrate transport apparatus that transports substrates between the storage chambers and the substrate support apparatus, is provided with a controller which, in the event that the temperature of substrate processing in a preceding substrate processing step is higher than the temperature of substrate processing in a subsequent substrate processing step, operates the substrate transport apparatus to transport the dummy substrate, whose temperature is lower than the temperature of substrate processing in the preceding substrate processing step, prior to carrying out the subsequent substrate processing step.

As a result of transporting the dummy substrate having a relatively low temperature to the substrate support apparatus having a higher temperature, the heat of the substrate support apparatus is transferred to the dummy substrate. This allows for the desired temperature to be reached in a shorter time than it would be by simply waiting for the temperature of the substrate support apparatus to decrease naturally. In addition, since all that needs to be done is to transport the dummy substrate to the substrate support apparatus in the same manner as with regular substrate processing, the configuration of the apparatus remains simple.

The semiconductor manufacturing apparatus, which is a semiconductor manufacturing apparatus provided with a first storage chamber that stores a substrate to be processed, a second storage chamber that stores a dummy substrate, a substrate support apparatus with a heating function that supports a substrate, and a substrate transport apparatus that transports substrates between the storage chambers and the substrate support apparatus, is provided with a controller which, in the event that the temperature of substrate processing in a preceding substrate processing step is higher than the temperature of substrate processing in a subsequent substrate processing step by at least a predetermined temperature, operates the substrate transport apparatus to transport the dummy substrate, whose temperature is lower than the temperature of substrate processing in the preceding substrate processing step, prior to carrying out the subsequent substrate processing step.

Since the need for dummy substrate transport is determined by comparing the difference between the temperatures of substrate processing in the preceding substrate processing step and in the subsequent substrate processing step with a predetermined temperature, this is more practically useful in comparison with the previous configuration.

In order to enhance the cooling effect, it is desirable to provide a cooling apparatus for dummy substrate cooling. Transporting a cooled dummy substrate to the substrate support apparatus further improves the rate of cooling of the substrate support apparatus.

In addition, a temperature measurement apparatus that measures the temperature of the substrate support apparatus may be provided for various purposes (e.g., such as in order to determine when to stop the transport of the dummy substrate).

Over time, the substrate temperature of the dummy substrate transported to the substrate support apparatus increases and its cooling capability decreases. Accordingly, a configuration in which the second storage chamber stores multiple dummy substrates and the transport of the dummy substrates is performed multiple times may be used in order to improve the capability to cool the substrate support apparatus.

One method for cooling a substrate support apparatus is a method for cooling a substrate support apparatus used in a semiconductor manufacturing apparatus provided with a first storage chamber that stores a substrate to be processed, a second storage chamber that stores a dummy substrate, a substrate support apparatus with a heating function that supports a substrate, and a substrate transport apparatus that transports substrates between the storage chambers and the substrate support apparatus, wherein, in the event that the temperature of substrate processing in a preceding substrate processing step is higher than the temperature of substrate processing in a subsequent substrate processing step, a dummy substrate, whose temperature is lower than the temperature of substrate processing in the preceding substrate processing step, is transported prior to carrying out the subsequent substrate processing step.

One more practically useful technique is a method for cooling a substrate support apparatus used in a semiconductor manufacturing apparatus provided with a first storage chamber that stores a substrate to be processed, a second storage chamber that stores a dummy substrate, a substrate support apparatus with a heating function that supports a substrate, and a substrate transport apparatus that transports substrates between the storage chambers and the substrate support apparatus, wherein, in the event that the temperature of substrate processing in a preceding substrate processing step is higher than the temperature of substrate processing in a subsequent substrate processing step by at least a predetermined temperature, a cooling method is used that involves transporting a dummy substrate, whose temperature is lower than the temperature of substrate processing in the preceding substrate processing step, prior to carrying out the subsequent substrate processing step.

Effects of the Invention

Transporting the dummy substrate to the substrate support apparatus at an elevated temperature causes the heat of the substrate support apparatus to be transferred to the dummy substrate. This allows for the desired temperature to be reached in a shorter time than it would be by simply waiting for the temperature of the substrate support apparatus to decrease naturally. In addition, since all that needs to be done is to transport the dummy substrate to the substrate support apparatus in the same manner as with regular substrate processing, the configuration of the apparatus remains simple.

DETAILED DESCRIPTION

Figure 1:
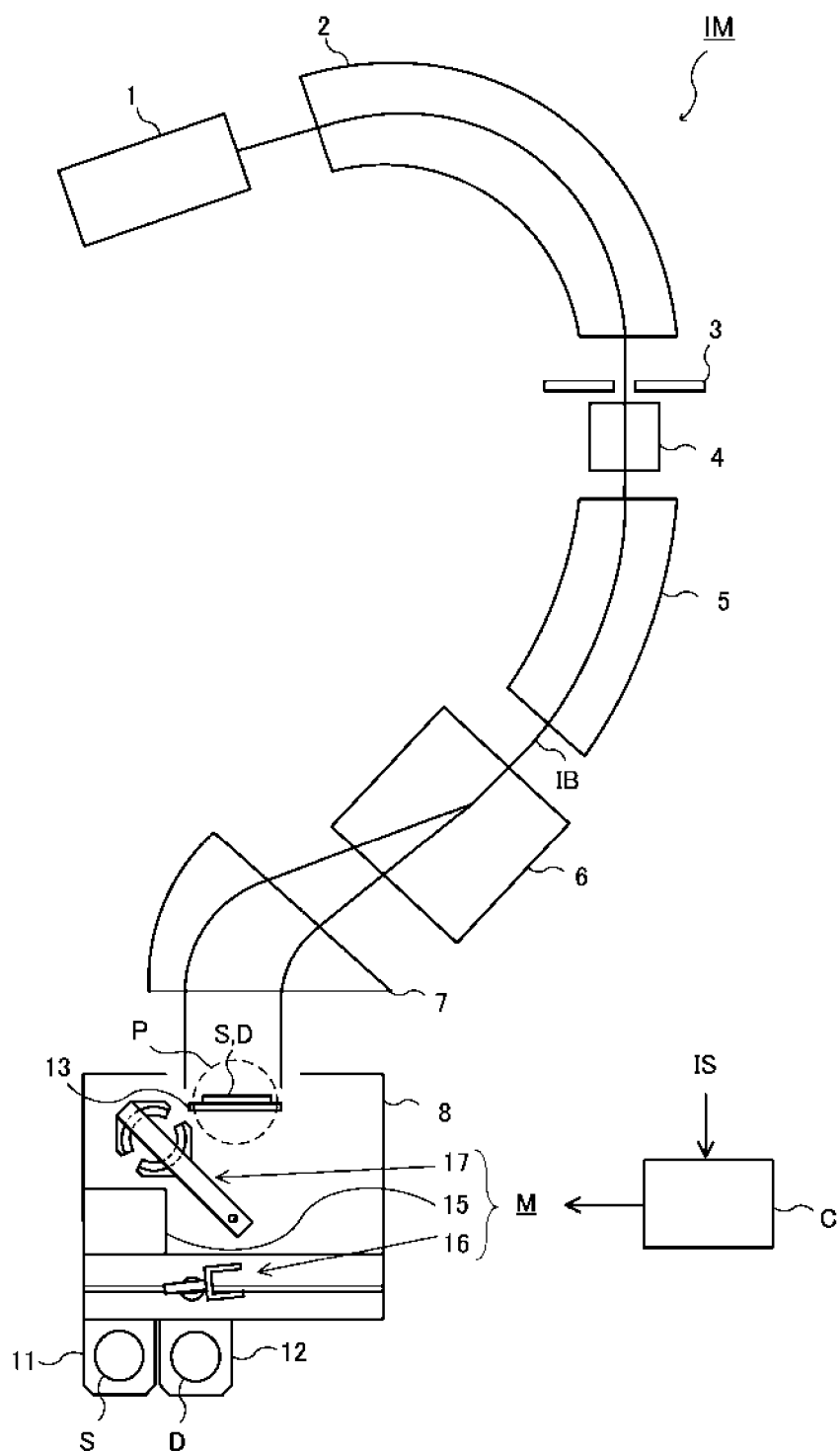
FIG. 1
A schematic diagram illustrating the ion implanter in its entirety.

The configuration of the apparatus will be schematically described with reference to FIG. 1 using an ion implanter IM as an example of the semiconductor manufacturing apparatus.

An ion source 1 emits a substantially spot-shaped ion beam IB, a mass analyzer magnet 2 and an analyzing slit 3 mass analyze the ion beam IB emitted from the ion source 1, and an accelerator/decelerator apparatus 4 accelerates or decelerates the same ion beam IB. Subsequently, an energy separator 5 passes the ion beam IB, which has been stripped of unnecessary energy components, further downstream, and a scanner 6 scans the ion beam IB in one direction. As a result of passing through a parallelizer 7, the scanned ion beam IB is deflected and turned into ion beams IB with mutually parallel directions of beam transport, which are incident on a process chamber 8.

A substrate support apparatus 13 is provided in the process chamber 8. This substrate support apparatus 13, which supports a substrate to be processed S or a dummy substrate D on one of its sides with the help of an electrostatic chuck, a mechanical clamping mechanism, or both, is provided with a heating function that makes use of a heater or the like in the same manner as in Patent Document 1. The substrate to be processed S and dummy substrate D are wafers, such as Si or SiC, etc., or substrates such as glass substrates or the like; the substrate to be processed S is a production board that is subjected to ion implantation processing.

In this exemplary configuration, the substrate to be processed S and dummy substrate D are stored, respectively, in a first storage chamber 11 and a second storage chamber 12 provided outside of the process chamber 8.

The substrate transport apparatus M is an apparatus for transporting the substrates S and D between the storage chambers 11, 12 and the substrate support apparatus 13. The substrate transport apparatus M consists of an atmospheric robot 16, which transports substrates between the storage chambers 11, 12 and a preliminary vacuum chamber 15; a preliminary vacuum chamber 15, which is used for transporting substrates between different environments (i.e., atmosphere and vacuum); and a vacuum robot 17, which transports substrates between the preliminary vacuum chamber 15 and the substrate support apparatus 13.

The controller C, which is shown in the figure, is an apparatus for operating the substrate transport apparatus M based on input signals IS, such as substrate processing temperature and the like.

Figure 2:
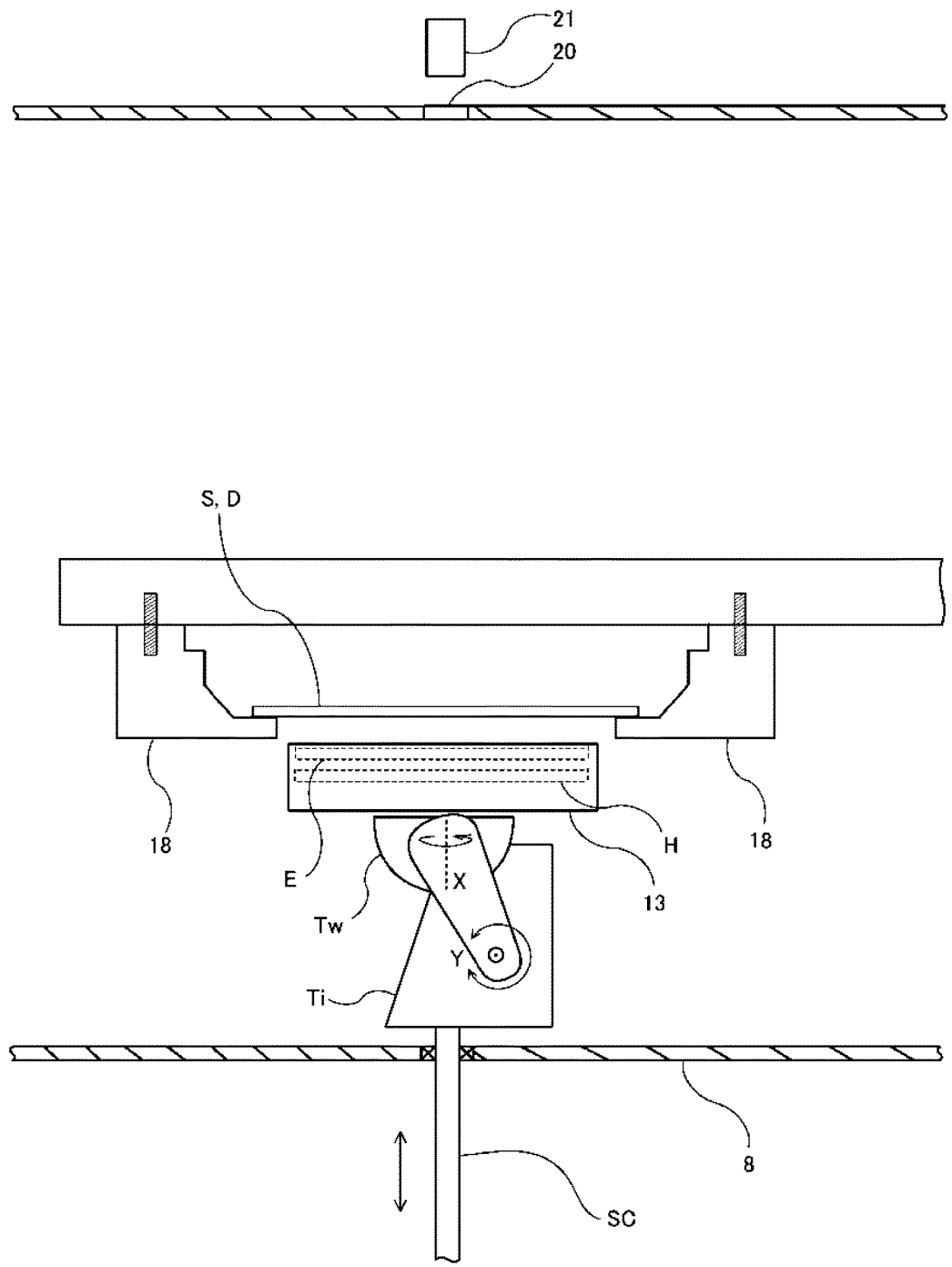
FIG. 2
A schematic diagram illustrating substrate handoff to the substrate support apparatus.

The vacuum robot 17 is provided with a rotary arm that rotates between the preliminary vacuum chamber 15 and the substrate support apparatus 13 provided in the implantation position P. FIG. 2 depicts a state in which a substrate is transported to the implantation position P while being supported by the gripping claw 18 of the rotary arm.

In this example, the substrate support apparatus 13 is provided with an electrostatic chuck E and a heater H. In addition, as the driving mechanism of the substrate support apparatus 13, there are provided a driving shaft SC, which reciprocally drives the substrate support apparatus 13 in the direction of the arrows with the help of a drive source (not shown); a twisting mechanism Tw, which rotates the substrate support apparatus 13 any number of degrees about the X axis; and a tilting mechanism Ti, which rotates the substrate support apparatus 13 any number of degrees about the Y axis. Furthermore, it is configured such that the temperature of the substrates S, D and the substrate support apparatus 13 can be measured from the ceiling of the process chamber 8 through a view port 20 using a radiation thermometer 21.

Once the rotary arm moves to the implantation position P, the substrate support apparatus 13, which is driven by the driving shaft SC, moves in the direction of the rotary arm (up the page), thereby effecting handoff of the substrates S, D to the substrate support apparatus 13. After the handoff of the substrates S, D to the substrate support apparatus 13, the rotary arm rotates in a direction away from the implantation position P. After that, the substrate support apparatus 13 is rotated by the tilting mechanism Ti about the Y axis such that the substrate surface to be processed faces the ion beam IB incident on the process chamber 8. The orientation of the substrate support apparatus 13 depicted in FIG. 1 is obtained after the tilting mechanism Ti rotates it approximately 90 degrees away from the orientation of the substrate support apparatus 13 depicted in FIG. 2.

Figure 3:
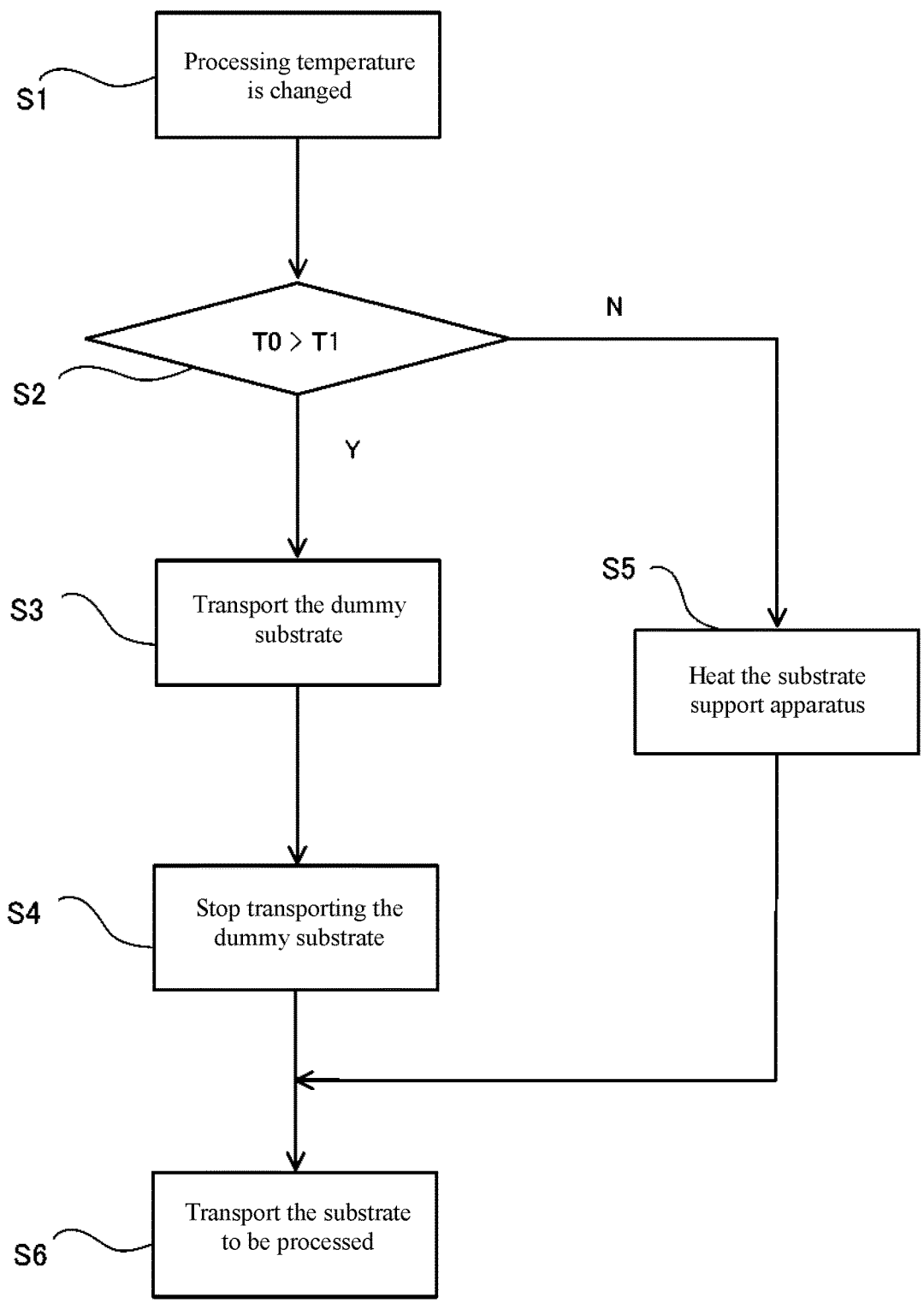
FIG. 3
A control flow diagram illustrating an example of control of the substrate transport apparatus.

FIG. 3 is a typical control flow diagram of the substrate transport apparatus M. Once a change in the temperature of substrate processing is received, a change is made in the set temperature of the substrate support apparatus 13 (S1).

Once this change is received, comparison is performed between the temperature of substrate processing in the preceding substrate processing step T0 and the temperature of substrate processing in the subsequent substrate processing step T1 (S2).

It should be noted that the "temperature of substrate processing," as referred to herein, is the set temperature of the substrate to be processed S during substrate processing and is the same as the set temperature of the substrate support apparatus 13.

If the comparison results in a determination that the temperature of substrate processing in the preceding substrate processing step T0 is higher than the temperature of substrate processing in the subsequent substrate processing step T1, the substrate transport apparatus 13 transports a dummy substrate D from the second storage chamber 12 to the substrate support apparatus 13, prior to carrying out the subsequent substrate processing step (S3).

The substrate support apparatus 13 supports the dummy substrate D while being driven by the driving shaft SC, tilting mechanism Ti, etc. in the same manner as when processing the substrate to be processed S. After a series of driving operations, the dummy substrate D is returned to the second storage chamber 12 by the substrate transport apparatus M, and the transport of the dummy substrate D stops (S4).

It should be noted that, until the change in the substrate processing temperature is complete, the ion beam IB is not incident on the process chamber 8 because the operation of the ion source 1 is stopped, etc., so that the dummy substrate D is not irradiated by the ion beam.

In this example, the dummy substrate D is stored in the second storage chamber 12 at room temperature. Transporting the dummy substrate D, which is at room temperature, to the substrate support apparatus 13, which is at an elevated temperature, causes the heat of the substrate support apparatus 13 to be transferred to the dummy substrate D. This allows for the desired temperature to be set in a shorter time than it would be by simply waiting for the temperature of the substrate support apparatus 13 to decrease naturally. In addition, since all that needs to be done is to transport the dummy substrate D to the substrate support apparatus 13 in the same manner as with regular substrate processing, the configuration of the apparatus remains simple.

On the other hand, in the event that comparison between the substrate processing temperatures results in a determination that the temperature of substrate processing in the preceding substrate processing step is lower than the temperature of substrate processing in the subsequent substrate processing step, the substrate support apparatus 13 is heated using a heater or the like in order to bring the temperature of the substrate support apparatus 13 to the temperature required in the subsequent substrate processing step (S5).

Finally, once the temperature of the substrate support apparatus 13 reaches the desired temperature, the substrate to be processed S is transported by the substrate transport apparatus M and ion implantation processing is performed on the substrate to be processed S (S6).

Although the control flow diagram of FIG. 3 is carried out by controller C depicted in FIG. 1, the operator of the ion implanter IM may compare the temperatures, etc., and operate the substrate transport apparatus M as appropriate.

Figure 4:
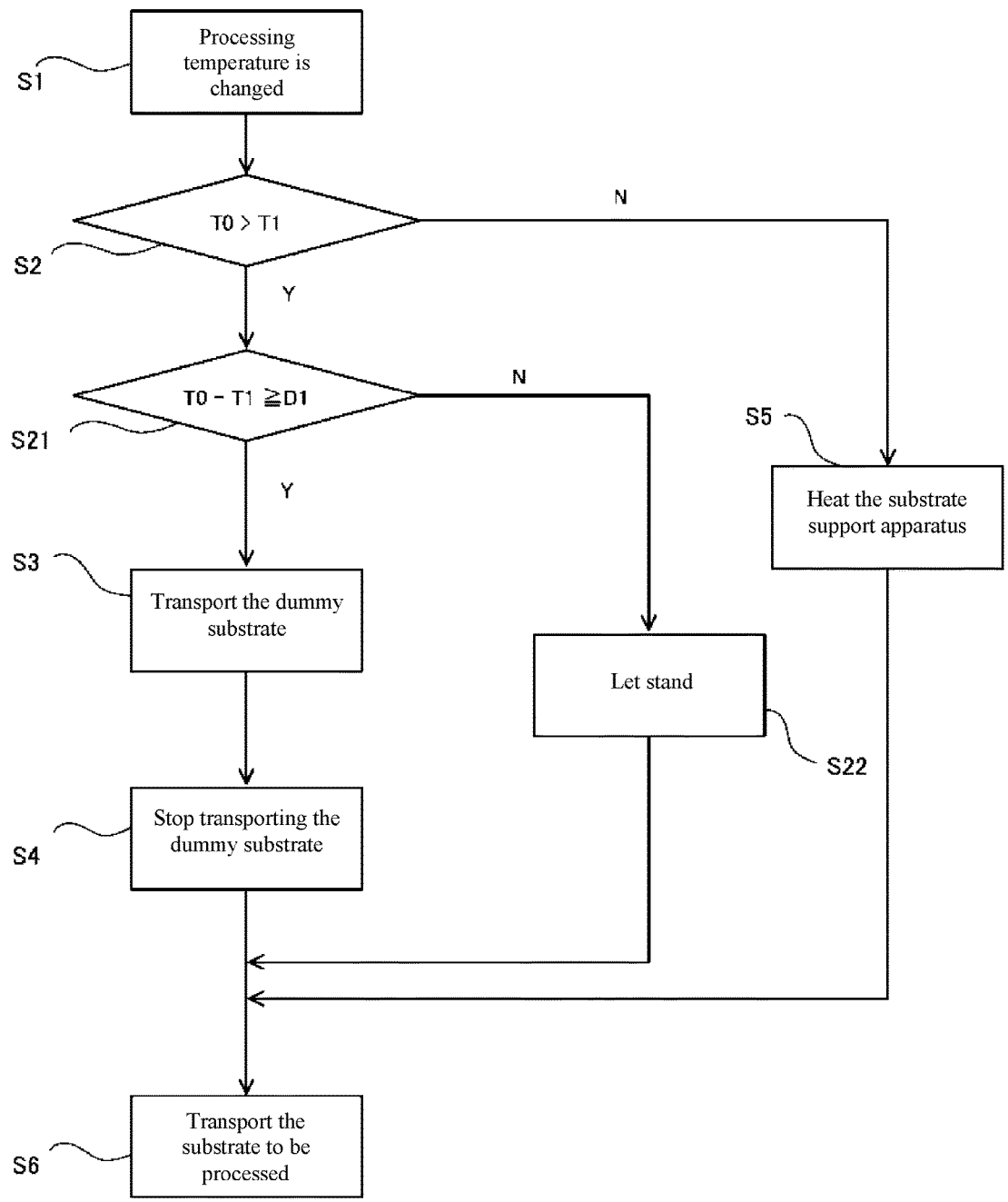
FIG. 4
A control flow diagram illustrating a different example of control of the substrate transport apparatus.
Figure 5:
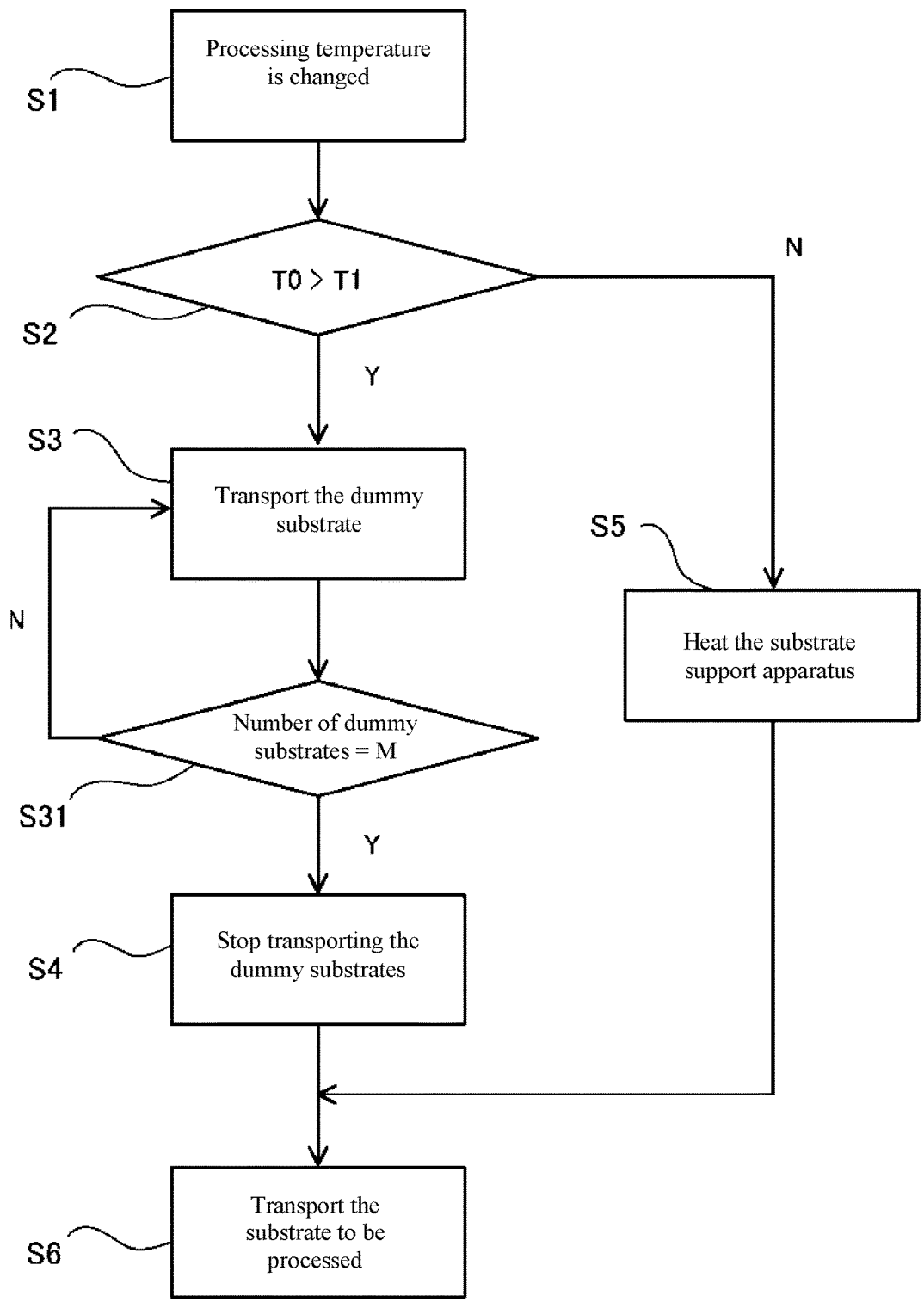
FIG. 5
A control flow diagram illustrating another example of control of the substrate transport apparatus.

In addition to the typical control flow diagram of FIG. 3, carrying out the control flow diagrams depicted in FIG. 4 and FIG. 5 achieves the same effects as those obtained when carrying out the control flow diagram of FIG. 3.

In the control flow diagrams depicted in FIG. 4 and FIG. 5, the processing of steps S1-S6, which share reference numerals with FIG. 3, is identical to the processing explained in FIG. 3. For this reason, their description is omitted and the discussion below will focus on their differences from the control flow diagram of FIG. 3.

In the control flow diagram of FIG. 4, in the event that the temperature of substrate processing in the preceding substrate processing step T0 is higher than the temperature of substrate processing in the subsequent substrate processing step T1, the difference between the preceding and subsequent substrate processing temperatures T0-T1 is compared with a reference value D1 (S21). The dummy substrate D is transported if this comparison results in a determination that the temperature difference is greater than the reference value.

On the other hand, if the comparison with the reference value D1 results in a determination that the temperature difference is lower than the reference value, the dummy substrate D is not transported and the substrate support apparatus 13 is cooled naturally (S22).

The apparatus may be configured such that, when there is almost no difference between the preceding and subsequent substrate processing temperatures (e.g., a few degrees), the dummy substrate D is not transported and the temperature of the substrate support apparatus 13 is allowed to drop through natural cooling, and the substrate support apparatus 13 is cooled by transporting the dummy substrate D only if the temperature difference is as large as several hundred degrees.

The control flow diagram of FIG. 5 takes into account transporting multiple dummy substrates D to the substrate support apparatus 13. The dummy substrates D transported between the substrate support apparatus 13 and the second storage chamber 12 are counted and dummy substrate transport is repeated until the sum reaches a predetermined number of substrates (M substrates) (S31).

Over time, the substrate temperature of the dummy substrates D transported to the substrate support apparatus 13 increases and their cooling capability decreases. With this in mind, the control flow diagram of FIG. 5 shows multiple dummy substrates D being transported and each new dummy substrate D possessing a strong cooling effect is successively transported to the substrate support apparatus 13, thereby improving the cooling efficiency of the substrate support apparatus 13.

The control flow diagrams described in FIG. 4 and FIG. 5 can be combined and other processes can be added to these control flow diagrams.

As far as the number of transported dummy substrates D is concerned, the appropriate number is obtained in advance through experimentation, etc., under the typical conditions associated with changes in the temperature of substrate processing. The relationship between the conditions associated with these changes and the number of transported substrates is stored as data in the controller C, and when there are actual changes in the substrate processing temperature, the number of transported substrates is determined by reading out data associated with similar conditions from the stored data.

In addition, the temperature of the substrate support apparatus 13 may be measured in order to determine when the transport of the dummy substrate D is to be stopped.

After initiating the transport of the dummy substrate D, the temperature of the substrate support surface of the substrate support apparatus 13 is measured using the radiation thermometer 21 depicted in FIG. 2 at a time when the dummy substrate D is not supported on the substrate support surface of the substrate support apparatus 13, and the transport of the dummy substrate D is terminated if this temperature is close to the desired temperature.

As far as measuring the temperature of the substrate support apparatus 13 is concerned, in addition to the radiation thermometer 21 depicted in FIG. 2, the temperature of the substrate support apparatus 13 may be measured using a thermocouple.

While the above-described embodiment describes a configuration in which the first storage chamber 11 and the second storage chamber 12 are provided separately, it is possible to use a configuration in which these storage chambers are the same, as a single storage chamber.

Figure 6:
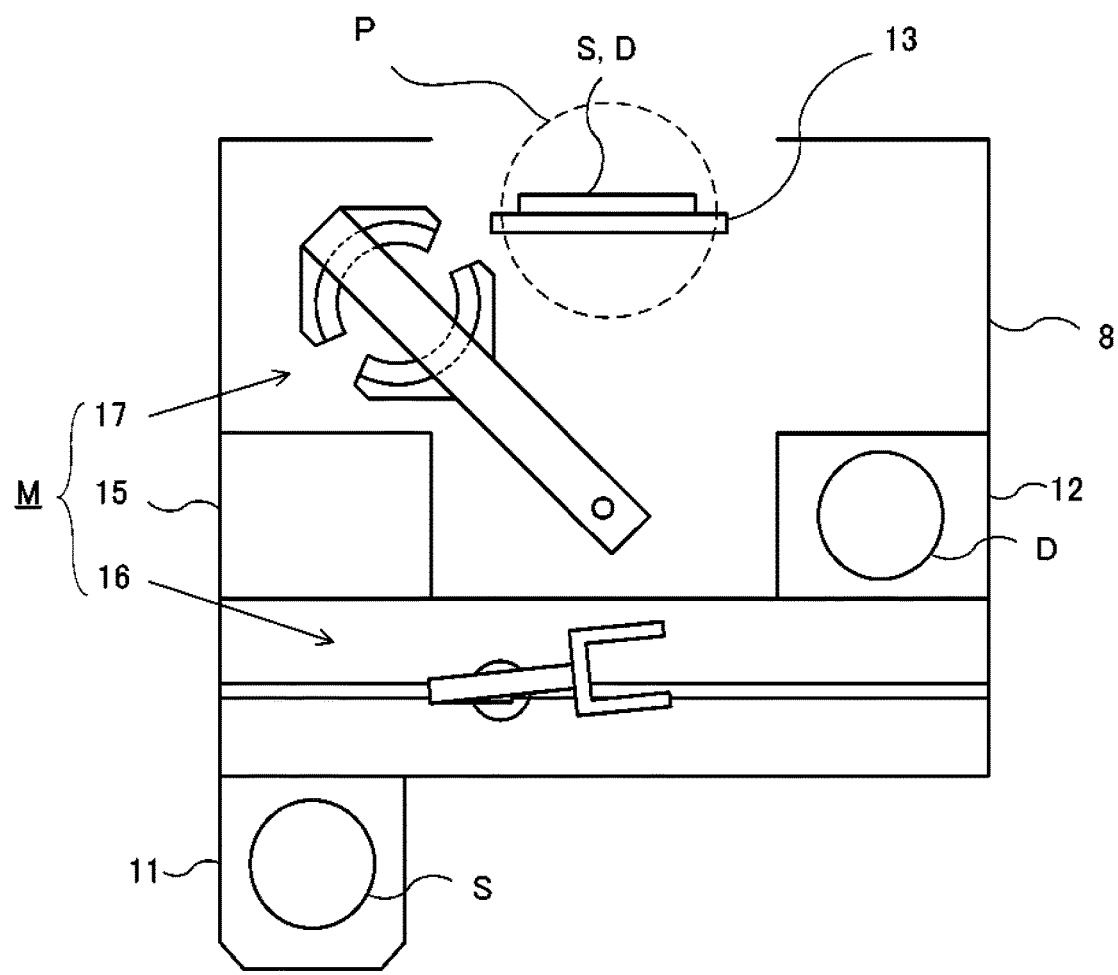
FIG. 6
A schematic diagram illustrating an exemplary configuration in which the second storage chamber is provided in the process chamber.

In addition, as depicted in FIG. 6, a second storage chamber 12 may be provided in the vacuum atmosphere of the process chamber 8. In the present invention, the dummy substrate D is a substrate used to cool the substrate support apparatus 13 and, therefore, it does not necessarily have to be brought in from the atmosphere side and then transported back to the atmosphere side. Providing the second storage chamber 12 in the process chamber 8 makes it possible to eliminate the relatively time-consuming operations of evacuation and opening to atmosphere, which are performed in the preliminary vacuum chamber 15, when transporting the dummy substrate D to the substrate support apparatus 13, and, as a result, the time required for the transport of the dummy substrate D can be substantially shortened. In such a case, the substrate transport apparatus M for the dummy substrate D will consist only of the vacuum robot 17.

In addition, a cooled dummy substrate D may be transported to the substrate support apparatus 13 if a cooling apparatus is installed in the transport path of the dummy substrate D. A cooled dummy substrate D would improve the cooling effect in comparison with a dummy substrate D at room temperature.

As examples of the cooling apparatus, configurations involving installing a mechanism that blows air, nitrogen, or other coolants at the dummy substrate D in the preliminary vacuum chamber 15 or providing a coolant channel for coolant to flow through the second storage chamber 12 and a mechanism that would use this to cool the dummy substrate D, and so forth, may be considered.

In addition, it goes without saying that the present invention is not limited to the embodiments described above and various modifications may be made without departing from its spirit.

DESCRIPTION OF THE REFERENCE NUMERALS

11 First storage chamber
12 Second storage chamber
13 Substrate support apparatus
M Substrate transport apparatus
S Substrate to be processed
D Dummy substrate
C Controller

The invention claimed is:

1. A semiconductor manufacturing apparatus, comprising:
a first storage chamber that stores a substrate to be processed;
a second storage chamber that stores a dummy substrate;
a substrate support apparatus with a heating function that supports a substrate; and
a substrate transport apparatus that transports substrates between the storage chambers and the substrate support apparatus,
wherein the semiconductor manufacturing apparatus comprises,
a controller which, in the event that the temperature of substrate processing in a preceding substrate processing step is higher than the temperature of substrate processing in a subsequent substrate processing step, operates the substrate transport apparatus to transport the dummy substrate, whose temperature is lower than the temperature of substrate processing in the preceding substrate processing step, prior to carrying out the subsequent substrate processing step.

2. The semiconductor manufacturing apparatus according to claim 1, wherein said apparatus comprises a cooling apparatus that cools the dummy substrates.

3. The semiconductor manufacturing apparatus according to claim 1, wherein said apparatus comprises a temperature measurement apparatus that measures the temperature of the substrate support apparatus.

4. The semiconductor manufacturing apparatus according to claim 1, wherein
a plurality of dummy substrates are stored in the second storage chamber and the transport of the dummy substrates is performed a plurality of times.

5. A semiconductor manufacturing apparatus, comprising:
a first storage chamber that stores a substrate to be processed;
a second storage chamber that stores a dummy substrate;
a substrate support apparatus with a heating function that supports a substrate; and
a substrate transport apparatus that transports substrates between the storage chambers and the substrate support apparatus, wherein the semiconductor manufacturing apparatus comprises, a controller which, in the event that the temperature of substrate processing in a preceding substrate processing step is higher than the temperature of substrate processing in a subsequent substrate processing step by at least a predetermined temperature, operates the substrate transport apparatus to transport the dummy substrate, whose temperature is lower than the temperature of substrate processing in the preceding substrate processing step, prior to carrying out the subsequent substrate processing step.

6. The semiconductor manufacturing apparatus according to claim 5, wherein said apparatus comprises a cooling apparatus that cools the dummy substrates.

7. The semiconductor manufacturing apparatus according to claim 5, wherein said apparatus comprises a temperature measurement apparatus that measures the temperature of the substrate support apparatus.

8. The semiconductor manufacturing apparatus according to claim 5, wherein
a plurality of dummy substrates are stored in the second storage chamber and the transport of the dummy substrates is performed a plurality of times.

* * * * *